United States Patent [19]

Okanobu

[11] Patent Number: 4,659,949
[45] Date of Patent: Apr. 21, 1987

[54] PHASE-LOCKED LOOP CIRCUIT
[75] Inventor: Taiwa Okanobu, Tokyo, Japan
[73] Assignee: Sony Corporation, Tokyo, Japan
[21] Appl. No.: 817,506
[22] Filed: Jan. 9, 1986

Related U.S. Application Data
[62] Division of Ser. No. 611,503, May 17, 1984.

[30] Foreign Application Priority Data
May 25, 1983 [JP] Japan ................... 58-92065
[51] Int. Cl.⁴ .............. G01R 25/00; H03L 7/00
[52] U.S. Cl. ................................ 307/511; 307/514;
331/8; 331/27; 328/155
[58] Field of Search ............ 307/511, 513–514;
331/8, 27; 328/155

[56] References Cited
U.S. PATENT DOCUMENTS
3,821,658 4/1973 Hoeft ................................. 331/27

Primary Examiner—Stanley D. Miller
Assistant Examiner—M. R. Wambach
Attorney, Agent, or Firm—Lewis H. Eslinger; Alvin Sinderbrand

[57] ABSTRACT

A phase comparing circuit can be made as a semiconductor integrated circuit for inclusion in a phase-locked loop for generating a phase-locked output signal synchronized with a pilot signal. The phase comparing circuit generates first and second reference signals with reverse polarity about their DC level from the pilot signal and first and second base signals having a DC level substantially the same as the DC level of the reference signals. First and second switching signals with reverse polarity about their DC level are generated from the phase-locked output signal. A plurality of bipolar transistors are operated by the switching signals alternately to provide first and third current paths and second and fourth current paths connecting the reference and base signals to cancel the DC components therefrom. A voltage deriving circuit provides a control signal current path that connects the first and third current paths and the second and fourth current paths. The control signal current path includes two control signal output terminals that have two series-connected resistors between them and a bias potential connected between the output terminals. The control signal at the output terminals represents the difference in phase between the switching and the pilot signals and is used to generate a locking signal for controlling a voltage-controlled oscillator which provides the phase-locked output signal.

6 Claims, 4 Drawing Figures

PHASE-LOCKED LOOP CIRCUIT

This is a divisional of application Ser. No. 06/611,503, filed May 17, 1984.

BACKGROUND OF THE INVENTION

1. Field of the Invention

The present invention relates to a phase comparing circuit, and more particularly to a phase comparing circuit for use with a phase-locked loop.

2. Description of the Prior Art

A phase-locked loop circuit is used for generating an output signal that is synchronized with a pilot signal having a known frequency. For example, a phase-locked loop circuit is used in the stereo demodulating circuit of an FM receiver to generate a subcarrier signal of 38 KHz synchronized a pilot signal of 19 KHz. A phase-locked loop circuit typically includes a phase comparing circuit that compares the phases of the phase-locked output signal, or a multiple of it, and of the pilot signal to keep those two signals synchronized. The phase comparing circuit provides a control signal that is amplified and used to control a voltage-controlled oscillator that generates the output signal.

With known phase-locked loop circuits it has proved difficult to incorporate the phase-locked loop in an integrated circuit. In one known phase-locked loop circuit, transistors in the phase comparing circuit require base currents which, to provide a sufficiently small resistance in the transistors when they are on, must be so large that the integrated circuit cannot prevent current leakage between the various integrated circuit elements. Providing a sufficiently large loop gain makes it necessary also to provide the pilot signal at a high enough current level to suppress the DC offset at the input terminal of the amplifier used in the phase-locked loop, and that leads to the same current leakage problem.

An alternate configuration for a phase-locked loop circuit is available to overcome those problems. However, that configuration uses a pair of resistors which must be provided with almost exactly the same resistance. The formation of resistances in integrated circuits to the accuracy required to effectuate this solution is difficult. To overcome that deficiency, a separate control must be used to equalize the resistances. But providing a separate control defeats the purpose of forming the phase-locked loop on an integrated circuit.

SUMMARY OF THE INVENTION

It is an object of the present invention to overcome those shortcomings of prior art phase comparing circuits.

It is another object of the present invention to provide a phase comparing circuit suitable for use with a phase-locked loop which can be formed as an integrated circuit.

According to an aspect of the present invention, a phase comparing circuit is used to generate a control signal that is representative of the difference in phase between an input signal and a pilot signal. The phase comparing circuit comprises converting means for converting the pilot signal into a first reference signal and a second reference signal 180° out of phase with the first reference signal and a base signal generating means for providing first and second base signals having a predetermined DC level which is substantially the same as the DC level of the reference signals. The phase comparing circuit also comprises a phase-difference signal generating means that is operable in response to the input signal for alternately providing first and second current paths connecting the first base signal and the second reference signal to cancel the DC components therefrom and for alternately providing third and fourth current paths connecting the second base signal and the first reference signal to cancel the DC components therefrom, the first and third current paths and the second and fourth current paths being provided together. The phase comparing circuit also comprises voltage deriving circuit means that includes a control signal current path which connects the first and third current paths with the second and fourth current paths and has two control signal output terminals, two series-connected resistors between the control signal output terminals and a bias terminal between the resistors for accepting a bias potential.

The above and other objects, features and advantages of the present invention will be apparent when considering the detailed description of the preferred embodiments of the invention which are described below.

DETAILED DESCRIPTION OF THE PREFERRED EMBODIMENTS

To understand the advantages and features of the present invention better, two prior art phase-locked loop configurations will be considered first.

Figures 1, 2:
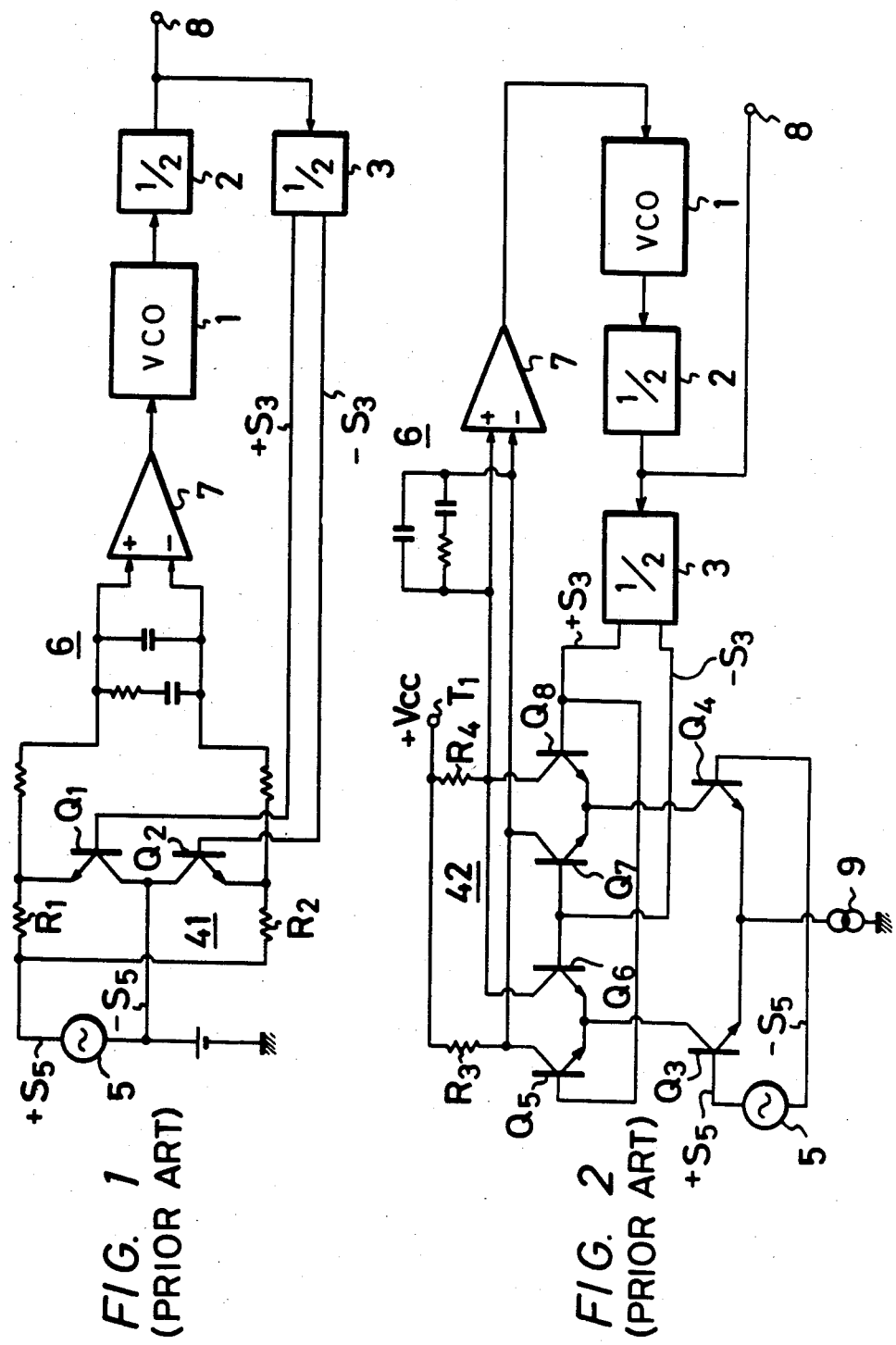
FIG. 1 is a schematic representation of a prior art phase-locked loop circuit that presents a current leakage problem if incorporated in an integrated circuit.
FIG. 2 is a schematic diagram of a second type of prior art phase-locked loop that solves the problem associated with the circuit shown in FIG. 1 but requires a separate control to calibrate resistances.

As shown in FIG. 1, a prior art phase-locked loop comprises a voltage-controlled oscillator 1 which provides a phase-locked output signal controlled by the level of a locking signal provided thereto. The desired frequency of the phase-locked output signal provided by the VCO 1 is 76 KHz. A frequency divider 2 divides the output of the VCO 1 in half to provide a signal of 38 KHz. That signal is divided in half again by a frequency-and-phase divider 3. The divider 3 provides an input signal $S_3$ as a first switching signal $+S_3$ and a second switching signal $-S_3$ that has opposite polarity relative to the first switching signal $+S_3$ about the DC level of the input signal. The input signal has a "nominal" frequency of 19 KHz. The switching signals $+S_3$ and $-S_3$ preferably are provided as square waves. A pilot signal generator 5 provides a pilot signal $S_5$ at a known frequency of 19 KHz. The switching signals are provided to a phase-comparing circuit 41. In the phase-comparing circuit 41 the phase of the input signal $S_3$ is compared with the phase of the pilot signal $S_5$. The pilot signal $S_5$ is provided as two pilot components, a first pilot component $+S_5$ and a second pilot component $-S_5$, which is 180° out of phase with the first pilot component $+S_5$. The pilot signals $+S_5$ and $-S_5$ are also provided to the phase-comparing circuit 41 as square waves.

The phase-comparing circuit 41 comprises first and second npn-type bipolar transistors $Q_1$ and $Q_2$ and two resistors $R_1$ and $R_2$. The switching signals $+S_3$ and $-S_3$ are provided to the bases of the bipolar transistors $Q_1$ and $Q_2$, respectively. The collectors of the two bipolar transistors are connected together and accept the second pilot component $-S_5$. The emitters of both bipolar transistors $Q_1$ and $Q_2$ accept the first pilot component $+S_5$ through the resistors $R_1$ and $R_2$, respectively. A control signal is provided at the emitters of the bipolar transistors $Q_1$ and $Q_2$ and is provided through a loop filter 6 to a differential amplifer 7. The loop filter 6 converts the control signal to a DC signal and the differential amplifer 7 provides the locking signal to the VCO 1. The frequency provided by the VCO 1 is varied in accordance with the level of the locking signal provided by the differential amplifier 7. The constant 38 KHz output of the frequency divider 2, which is locked in synchronization with the pilot signal, is fed to an output terminal 8 where it can be used, for example, as a subcarrier signal in a stereo FM receiver.

The phase-locked loop shown in FIG. 1 requires that the collector-emitter resistance of the bipolar transistors $Q_1$ and $Q_2$ be low when those transistors are turned on by the switching signal $S_3$. Accordingly, the current level of the input signal must be relatively high. In addition, to make the loop gain of the phase-locked loop shown in FIG. 1 sufficiently large, the DC offset at the input terminal of the differential amplifier 7 must be as low as possible. The level of the pilot signal thus must also be fairly large. High current levels cause current leakage between components of an integrated circuit, and the phase-locked loop configuration shown in FIG. 1 is accordingly not ideally suited for use in an integrated circuit.

Some of the problems of the phase-locked loop shown in FIG. 1 are overcome by the prior art phase-locked loop circuit shown in FIG. 2. The phase-locked loop in FIG. 2 also comprises a voltage-controlled oscillator 1, a frequency divider 2, a frequency-and-phase divider 3, a pilot signal generator 5, a loop filter 6, a differential amplifier 7, and an output terminal 8, all of which perform the same functions as described in connection with FIG. 1. The phase comparing circuit 41 in the phase-locked loop of FIG. 1 is replaced by the phase comparing circuit 42 shown in FIG. 2.

The phase comparing circuit 42 in FIG. 2 includes a pair of npn-type bipolar transistors $Q_3$ and $Q_4$ connected as a differential amplifier with their commonly connected emitters connected to a source 9 of reference current. The phase comparing circuit 42 further includes two other sets of npn-type bipolar transistors which are differentially connected. The first pair of differentially connected transistors $Q_5$ and $Q_6$ have their commonly connected emitters connected to the collector of the transistor $Q_3$. The base of the transistor $Q_3$ accepts the first pilot component $+S_5$. The second pair of differentially connected transistors $Q_7$ and $Q_8$ have their commonly connected emitters connected to the collector of the transistor $Q_4$, the base of which accepts the second pilot component $-S_5$. The bases of the transistors $Q_6$ and $Q_7$ accept the second switching signal $-S_3$ and the bases of the transistors $Q_5$ and $Q_8$ accept the first switching signal $+S_3$. The collectors of the transistors $Q_5$ and $Q_7$ are connected together and, through the resistor $R_3$, to a terminal $T_1$, which accepts a reference voltage from a power source $+V_{cc}$. The collectors of the transistors $Q_6$ and $Q_8$ are also connected together and, through a resistor $R_4$, to the terminal $T_1$. The collectors of the transistors $Q_5$ and $Q_7$ provide one control signal output terminal and the collectors of the transistors $Q_6$ and $Q_8$ provide a second control signal output terminal. The control signal appears at those output terminals and is converted to a DC signal by the loop filter 6 as described in connection with FIG. 1.

The phase comparing circuit 42 does not suffer the shortcomings of the phase-locked loop shown in FIG. 1. However, since it is necessary for a DC current to flow at all times to make the DC offset of the differential amplifier 7 sufficiently small, the resistance values of the resistors $R_3$ and $R_4$ must be identiical. However, the difficulty in providing identical resistance values for two resistors on an integrated circuit requires the use of a separate control for calibrating the resistance values of at least one of the resistors $R_3$ and $R_4$. The necessity of providing a separate control defeats the purpose of providing the phase-locked loop on an integrated circuit.

Figure 3:
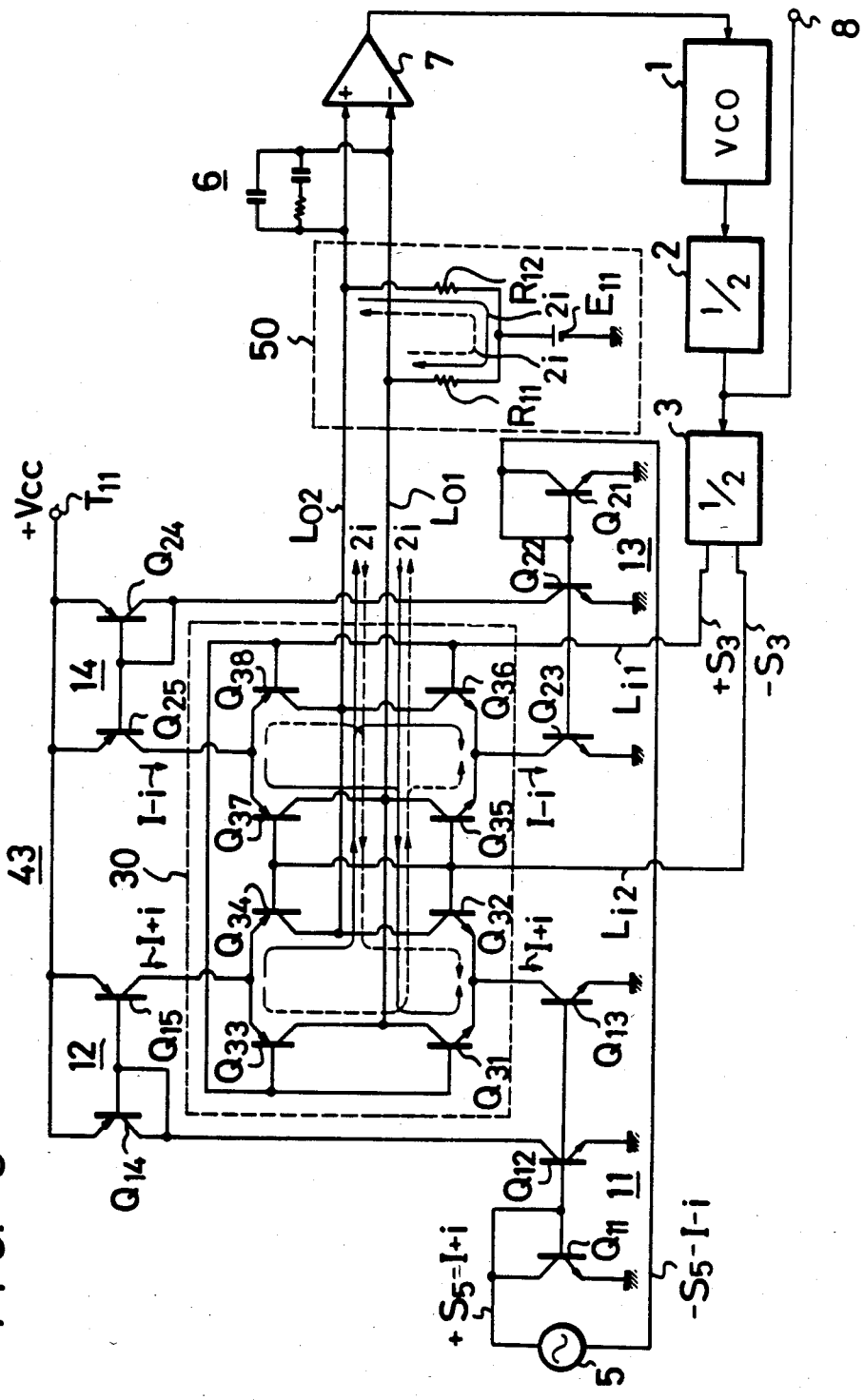
FIG. 3 is a schematic diagram of a phase-locked loop that incorporates a phase comparing circuit in accordance with a first embodiment of the present invention.

The phase-locked loop shown in FIG. 3 incorporates a phase comparing circuit 43 to overcome the problems associated with the phase-locked loops shown in FIGS. 1 and 2. As in FIGS. 1 and 2, the phase-locked loop shown in FIG. 3 includes a VCO 1, a frequency divider 2, a frequency-and-phase divider 3, a pilot signal generator 5, a loop filter 6, and a differential amplifier 7, and an output terminal 8. The differential amplifier 7 provides a locking signal to the VCO 1 which determines the frequency of the output thereof. The desired frequency of the phase-locked output signal generated by the VCO is 76 KHz. It is divided in half by the frequency divider 2 and provided both to the frequency-and-phase divider 3 and to the output terminal 8. The frequency-and-phase divider 3 provides the input signal $S_3$ as a first switching signal $+S_3$ and a second switching signal $-S_3$. The first switching signal $+S_3$ and the second switching signal $-S_3$ are of reverse polarity relative to the DC level of the input signal $S_3$. They are provided as square waves by the frequency-and-phase divider 3, each with a duty cycle of 50%. In other words, $+S_5$ and $-S_5$ have "opposite polarity" and alternate between their "high" and "low" levels at regular intervals, one being high while the other is low. The pilot signal generator 5 provides a pilot signal $S_5$ having a first pilot component $+S_5$ and an "opposite polarity" second pilot component $-S_5$. The pilot components are represented by the following equations:

$$+S_5 = I + i$$

$$-S_5 = I - i$$

where I represents the DC level or component of the pilot signal $S_5$ and i represents the AC component of the pilot signal $S_5$. It will be appreciated from these equations that the pilot components $+S_5$ and $-S_5$ are of reverse polarity relative to the DC level of the pilot signal.

The phase comparing circuit 43 shown in FIG. 3 comprises converting means and base signal generating means that use the pilot components to generate reference signals and base signals, respectively.

The converting means includes a first constant current source 11 for converting the first pilot component $+S_5$ into a first reference signal $I+i$. The first constant current source 11 comprises a first converting current mirror having an input transistor $Q_{11}$ for accepting at its collector the first pilot component $+S_5$. The base of the input transistor $Q_{11}$ is connected to its collector and to the base of a base-signal output transistor $Q_{12}$ and to the base of a first reference-signal output transistor $Q_{13}$. The first reference signal is provided at the collector of the transistor $Q_{13}$. The emitters of the transistors $Q_{11}$, $Q_{12}$ and $Q_{13}$ are grounded.

The base signal generating means includes a second constant current source 12, which comprises a first base-signal current mirror having an input transistor $Q_{14}$. The base-signal output transistor $Q_{12}$ has its collector connected to the collector of the input transistor $Q_{14}$. The base of the input transistor $Q_{14}$ is connected to its collector and to the base of an output transistor $Q_{15}$. The output transistor $Q_{15}$ of the first base-signal current mirror provides the first base signal $I+i$ at its collector identical to the first reference signal.

The second pilot component $-S_5$ is provided to a third constant source 13 that comprises a second converting current mirror having an input transistor $Q_{21}$, a second base-signal output transistor $Q_{22}$ and a second reference-signal output transistor $Q_{23}$, all of which have their bases connected. The base of the transistor $Q_{21}$ is connected to its collector. The emitters of the transistors $Q_{21}$, $Q_{22}$ and $Q_{23}$ are connected to ground. The second pilot component $-S_5$ is provided to the collector of the transistor $Q_{21}$ and the second reference signal $I-i$ appears at the collector of the transistor $Q_{23}$ in response to the second pilot component $-S_5$.

The collector of the second base-signal output transistor $Q_{22}$ is connected to a fourth constant current source 14 comprising the second base signal current mirror. The input transistor $Q_{24}$ thereof accepts at its collector, which is connected to its base, the output of the transistor $Q_{22}$ and the second base-signal current mirror output transistor $Q_{25}$ provides the second base signal $I-i$ as shown identical to the second reference signal. The transistors $Q_{14}$, $Q_{15}$, $Q_{24}$ and $Q_{25}$ all have their emitters connected to a reference terminal $T_{11}$ at which a reference potential $+V_{cc}$ is applied.

It will be appreciated that the first base signal and first reference signal are substantially identical and that the second reference signal and second base signal are also substantially identical but are of reverse polarity relative to their DC levels when compared to the first base signal and first reference signal. The constant current sources 11 and 13 thus comprise converting means for converting the pilot signal into a first reference signal and a second reference signal of opposite polarity to the first reference signal. The constant current sources 12 and 14 comprise base signal generating means for providing first and second base signals having a predetermined DC level substantially the same as the DC level of the reference signal.

The phase-locked loop shown in FIG. 3 includes a phase-difference signal generating means 30 which is operable in response to the input signal $S_3$. The phase-difference signal generating means comprises eight bipolar transistors. A first bipolar transistor $Q_{31}$ and a second bipolar transistor $Q_{32}$ are npn-type transistors having their emitters connected to each other and to the collector of the transistor $Q_{13}$. Third and fourth transistors $Q_{33}$ and $Q_{34}$ are pnp-type transistors having their emitters connected to the collector of the transistor $Q_{15}$. Fifth and sixth transistors of the npn-type, $Q_{35}$ and $Q_{36}$, have their emitters connected together and to the collector of the transistor $Q_{23}$. Seventh and eighth transistors of the pnp-type, $Q_{37}$ and $Q_{38}$, have their emitters connected together and to the collector of the transistor $Q_{25}$. The bases of the first, third, sixth and eighth transistors, $Q_{31}$, $Q_{33}$, $Q_{36}$ and $Q_{38}$, are connected together for receiving the first switching signal $+S_3$. The bases of the second, fourth, fifth and seventh transistors $Q_{32}$, $Q_{34}$, $Q_{35}$ and $Q_{37}$ are connected for receiving the second switching signal $-S_3$. The collectors of the first, third, fifth and seventh transistors, $Q_{31}$, $Q_{33}$, $Q_{35}$ and $Q_{37}$, are connected, as are the collectors of the second, fourth, sixth and eighth transistors, $Q_{32}$, $Q_{34}$, $Q_{36}$ and $Q_{38}$.

The phase-locked loop shown in FIG. 3 further comprises a voltage deriving means 50 which includes a control signal current path $L_{01}$ and $L_{02}$ that connects the collectors of the first, third, fifth and seventh transistors with the collectors of the second, fourth, sixth and eighth transistors. The voltage deriving means includes two control signal output terminals which have two series-connected resistors $R_{11}$ and $R_{12}$ connected between them. A source of bias potential $E_{11}$ is connected to a bias terminal between the resistors $R_{11}$ and $R_{12}$. The control signal output terminals provide the control signal to the differential amplifier 7 through the loop filter 6.

The phase-locked loop shown in FIG. 3 operates as follows. The phase-difference signal generating circuit 30 alternately provides first and second current paths connecting the first base signal and the second reference signal and alternately provides third and fourth current paths connecting the second base signal and the first reference signal, which cancels the DC components from the reference and base signals. The first and third current paths are provided together, as are the second and fourth current paths, in response to the input signal $S_3$.

More particularly, if $+S_3$ is low, or "0", and $-S_3$ is high, or "1", the transistors $Q_{33}$ and $Q_{35}$ are turned on to provide a first current path connecting the collector of the transistor $Q_{15}$, where the first base signal is provided, to the collector of the transistor $Q_{23}$, where the second reference signal is provided. At the same time, the transistors $Q_{34}$ and $Q_{36}$ are off, thus blocking the second current path between the first base signal and the second reference signal. Also at the same time, the transistors $Q_{32}$ and $Q_{38}$ are on, establishing the third current path, which connects the second base signal and the first reference signal, allowing the current $2i$ to flow as shown by the dotted lines in FIG. 3 since the first and third current paths are connected through the voltage deriving circuit 50. The fourth current path, through the transistors $Q_{31}$ and $Q_{37}$, is not established since $+S_3=0$ and $-S_3=1$ turns those transistors off.

When $+S_3=$"1" and $-S_3=$"0", the states of all of the transistors $Q_{31}$ through $Q_{38}$ are reversed, thus providing the second and fourth current paths and breaking the first and third current paths. The current $2i$ thus flows through the voltage deriving circuit 50 as shown by the solid lines in FIG. 3.

It will thus be appreciated that the first and third current paths are established only when the second and fourth are broken, and vice versa. The current $2i$ is provided in the voltage deriving circuit 50 because a control signal current path is provided connecting the first and third current paths and the second and fourth current paths of the phase-difference signal generating circuit 43. The phase-compared output voltage, or control signal, is thus developed across the resistors $R_{11}$ and $R_{12}$ and represents the comparison of the phases of $S_3$ and $S_5$. Of course, the control signal in the control signal current path can vary depending on phase differences between the pilot and input signals, and the variation is converted by the amplifier into a locking signal for controlling the frequency of the phase-locked output signal of the VCO 1.

Furthermore, since the phase comparing circuit 43 is current-driven, the voltage of the reference potential $+V_{cc}$ can be made as low as 1.8 volts, a level established in experiments with the present invention.

If, for example, the DC component I of the pilot signal $S_5$ is the same as the DC level used in the prior art phase comparing circuit 42 shown in FIG. 2, the output current of the embodiments of the present invention shown in FIG. 3 is twice that of the prior art circuit. The phasecompared output voltage of the voltage deriving circuit 50 or the sensitivity of the circuit can be increased by increasing the resistance of the resistors $R_{11}$ and $R_{12}$. In the circuit shown in FIG. 2, however, increasing the resistance of the resistors $R_3$ and $R_4$ to achieve an increase in the phase-compared voltage requires an increase in the reference voltage $+V_{cc}$. Of course, in the present invention, since only the signal portion $2i$ of the pilot signal is provided to the resistors $R_{11}$ and $R_{12}$, a relatively large phase-compared output voltage can still be obtained with a low reference potential $+V_{cc}$.

Another advantage of the present invention results from the absence of DC offset voltage applied to the amplifier 7, which permits increasing the loop gain of the phase-locked loop circuit. Furthermore, if the characteristics of the pnp-type and npn-type transistors in the phase-difference signal generating circuit 30 are made similar, the efficiency of the phase comparing circuit shown in FIG. 3 can be further increased.

In any case, since the control signal at the output terminals of the voltage deriving circuit 50, that is, across the resistors $R_{11}$ and $R_{12}$, does not include the DC component of the pilot signal $S_5$, the potential at the input to the amplifier 7 is determined solely by the bias potential $E_{11}$. In other words, the bias potential $E_{11}$ alone establishes the DC voltage of the signal applied to the amplifier 7, so that the DC level at both the inverting and non-inverting inputs of the amplifier 7 is the same.

In the embodiment of the invention shown in FIG. 3, the pilot and input signals are compared in phase with each other. Because the current mirrors 11-14 are used to provide the base and reference signals from the pilot signal, DC currents do not reach the resistors $R_{11}$ and $R_{12}$. And even should the DC components not be completely removed because of imbalances in the current mirrors, they will still be low enough with the present invention that the resistances of the resistors $R_{11}$ and $R_{12}$ l be effective with the tolerances normally found in integrated circuits. Thus, since the only other circuit components are symmetrically connected transistors, the phase comparing circuit in FIG. 3 can be easily made as an integrated circuit.

Figure 4:
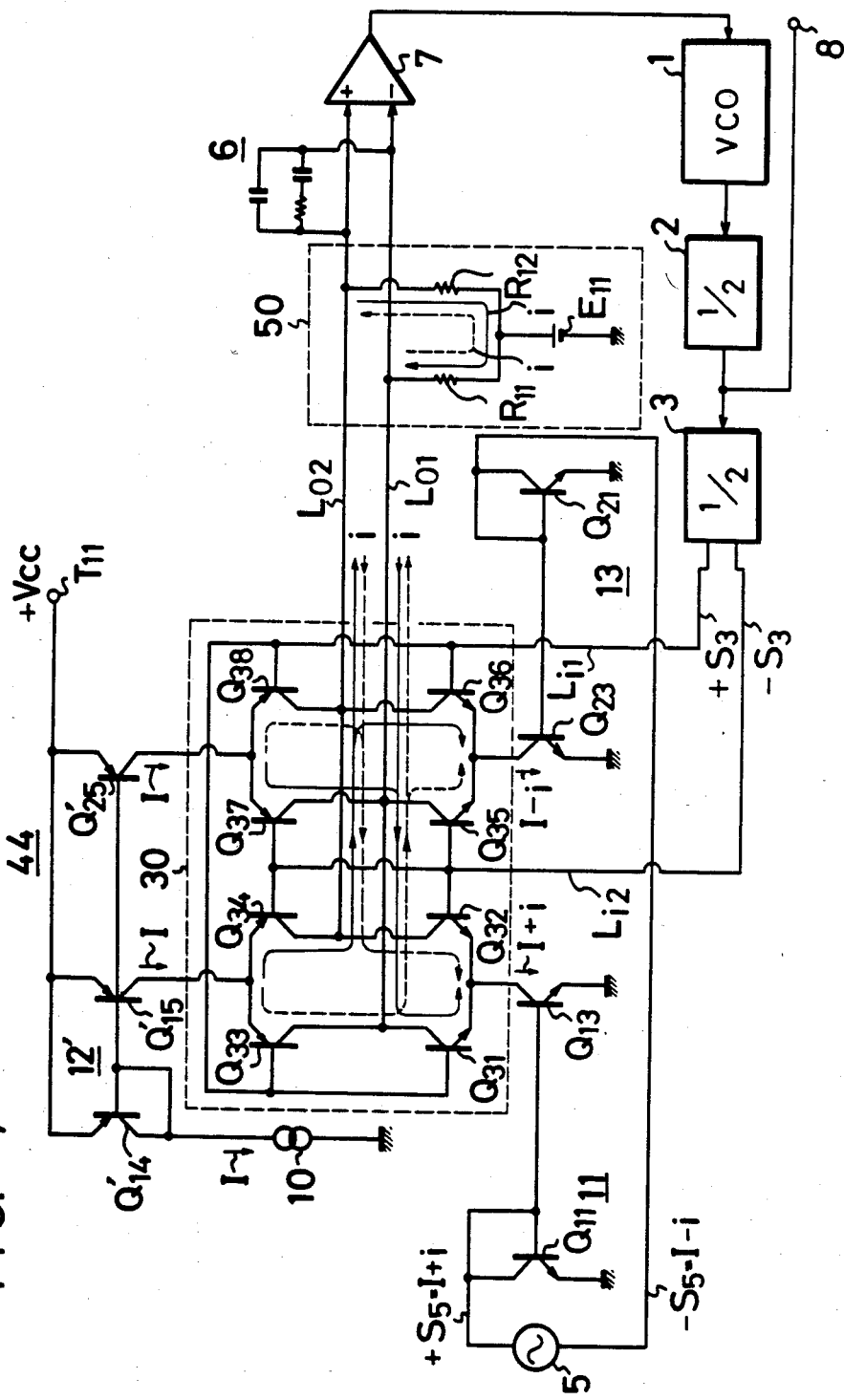
FIG. 4 is a schematic diagram of the phase-locked loop circuit shown in FIG. 3 that incorporates a modified phase comparing circuit in accordance with a second embodiment of the present invention.

Another embodiment of a phase comparing circuit 44 of the present invention is shown in FIG. 4. Reference numerals which are the same in FIGS. 3 and 4 denote the same elements in both drawings. In FIG. 4 the base signals are provided by a constant current source 12' accepts a reference DC current I from a reference current source 10. The reference current I has the same DC level as the pilot signal $S_5$. The constant current source 12' includes a base-signal current mirror having an input transistor $Q_{14}'$, the collector of which is connected to the current source 10. The base of the transistor $Q_{14}'$ is connected to its collector and to the bases of the two output transistors $Q_{15}'$ and $Q_{25}'$, at which are provided the first and second base signals, respectively. The emitters of the transistors $Q_{14}'$, $Q_{15}'$ and $Q_{25}'$ are connected to the terminal $T_{11}$, to which the reference potential $+V_{cc}$ is applied.

As shown in FIG. 4, the current flowing in the control signal current path in this embodiment is i, instead of $2i$ as in the embodiment of FIG. 3. Although that current is smaller, the embodiment shown in FIG. 4 enables the use of fewer transistors while achieving the same advantages as in the embodiment shown in FIG. 3. In particular, the basesignal output transistors $Q_{12}$ and $Q_{22}$ and the input transistor $Q_{24}$ of the second base-signal current mirror shown in FIG. 3 can be omitted. The embodiment shown in FIG. 4 operates the same as the embodiment shown in FIG. 3.

Thus, the present invention enables the construction of a phase comparing circuit that requires no adjustment and is extremely sensitive to phase differences in the output and pilot signals. It can also operate at low reference potentials and has no DC offset voltage in its phase-compared output voltage. And, it can be formed as an integrated circuit or as part of a phase-locked loop semiconductor integrated circuit.

Although specific embodiments of the invention have been described in detail herein with reference to the accompnaying drawings, it is to be understood that the invention is not limited to those embodiments, and that various changes and modifications can be effected therein by one skilled in the art without departing from the scope or spirit of the invention as defined in the appended claims.

What is claimed is:

1. A phase-locked loop circuit for providing a phase-locked output signal synchronized with a pilot signal having a first pilot component and a second pilot component of opposite polarity to the first pilot component, the circuit comprising:

a voltage-controlled oscillator for providing the phase-locked output signal at a frequency determined by a locking signal;

input signal generating means for providing an input signal synchronized with said phase-locked output signal;

converting means responsive to the pilot signal for converting the first pilot component into a first reference signal in phase with the first pilot component and having a predetermined DC level and for converting the second pilot component into a second reference signal in phase with the second pilot component and having said predetermined DC level;

a voltage source;

base signal generating means connected to the voltage source and said converting means for providing first and second base signals having said predetermined DC level;

phase-difference signal generating means connected to the converting means to receive said first and second reference signals and to the base signal generating means to receive said first and second base signals and operable in response to said input signal for alternately providing first and second current paths connecting said first base signal and said second reference signal to cancel the DC components therefrom and for alternately providing third and fourth current paths connecting said second base signal and said first reference signal to cancel the DC components therefrom, said first and third current paths and said second and fourth current paths being provided together;

voltage deriving circuit means connected to the phase-difference signal generating means and including a control signal current path connecting said first and third current paths with said second and fourth current paths and having two control signal output terminals, two series-connected resistors between said control signal output terminals, and a bias terminal between said resistors for accepting a bias potential; and amplifier means connected to said first and second control signal output terminals for generating said locking signal in response to said control signal.

2. A phase-locked loop circuit as in claim 1; further comprising a loop filter connected between said control signal output terminals and said amplifier means for providing said control signal as a DC signal.

3. A phase-locked loop circuit as in claim 2; wherein said amplifier means includes a differential amplifier having inverting and non-inverting inputs for accepting the signals at said respective control signal output terminals.

4. A phase-locked loop circuit as in claim 3; wherein said phase-difference signal generating means includes a plurality of bipolar transistors having the conductivity thereof controlled by said input signal.

5. A phase-locked loop circuit for providing a phase-locked output signal synchronized with a pilot signal having a first pilot component and a second pilot component of opposite polarity to the first pilot component, the circuit comprising:

a voltage-controlled oscillator for providing the phase-locked output signal at a frequency determined by a locking signal;

input signal generating means for providing an input signal synchronized with said phase-locked output signal, said input signal including a first switching signal and a second switching signal of opposite polarity to said first switching signal;

converting means responsive to the pilot signal for converting the first pilot component into a first reference signal in phase with the first pilot component and having a predetermined DC level and for converting the second pilot component into a second reference signal in phase with the second pilot component and having said predetermined DC level;

a voltage source;

base signal generating means connected to said voltage source and said converting means for providing first and second base signals having said predetermined DC level;

phase-difference signal generating means connected to the converting means and base signal generating means and operable in response to said input signal for alternately providing first and second current paths connecting said first base signal and said second reference signal to cancel the DC components therefrom and for alternately providing third and fourth current paths connecting said second base signal and said first reference signal to cancel the DC components therefrom, said first and third current paths and said second and fourth current paths being provided together, said phase-difference signal generating means including a plurality of bipolar transistors having the conductivity thereof controlled by said input signal, wherein said plurality of bipolar transistors is at least eight in number and includes first, second, fifth and sixth transistors of one type and third, fourth, seventh and eighth transistors or the other type;

the emitters of said first and second transistors, of said third and fourth transistors, of said fifth and sixth transistors and of said seventh and eight transistors, respectively, being connected for receiving, respectively, said first reference signal, said first base signal, said second reference signal and said second base signal;

the bases of said first, third, sixth and eight transistors being connected for receiving one of said switching signals and the bases of said second, fourth, fifth and seventh transistors being connected for receiving said other switching signal;

said phase-locked loop circuit further comprising voltage deriving circuit means connected to the phase-difference signal generating means and including a control signal current path connecting said first and third current paths with said second and fourth current paths and having two control signal output terminals, two series-connected resistors between said control signal output terminals, and a bias terminal between said resistors for accepting a bias potential, the collectors of said first, third, fifth and seventh transistors of said phase-difference signal generating means being connected to one of said control output terminals and the collectors of said second, fourth, sixth and eight transistors being connected to the other said control signal output terminal;

amplifier means connected to said first and second control signal output terminals for generating said locking signal in response to said control signal; and a loop filter connected between said control signal output terminals and said amplifier means for providing said control signal as a DC signal.

6. A phase-locked loop circuit as in claim 5; wherein said circuit is formed as an integrated circuit.

* * * * *